United States Patent
Lopatin et al.

(10) Patent No.: US 7,061,165 B2
(45) Date of Patent: Jun. 13, 2006

(54) ELECTROMECHANICAL CONVERTER COMPRISING AT LEAST ONE PIEZOELECTRIC ELEMENT

(75) Inventors: Sergej Lopatin, Lörrach (DE); Dietmar Birgel, Schopfheim (DE); Karl-Peter Hauptvogel, Bartenheim (FR)

(73) Assignee: Endress & Hauser GmbH & Co. KG, Maulburg (DE)

( * ) Notice: Subject to any disclaimer, the term of this patent is extended or adjusted under 35 U.S.C. 154(b) by 190 days.

(21) Appl. No.: 10/478,296

(22) PCT Filed: May 14, 2002

(86) PCT No.: PCT/EP02/05277

§ 371 (c)(1),
(2), (4) Date: Dec. 1, 2003

(87) PCT Pub. No.: WO02/099904

PCT Pub. Date: Dec. 12, 2002

(65) Prior Publication Data

US 2004/0145280 A1    Jul. 29, 2004

(30) Foreign Application Priority Data

Jun. 1, 2001    (DE) ................... 101 26 656

(51) Int. Cl.
*H01L 41/47* (2006.01)
(52) U.S. Cl. ............... 310/365; 310/364; 310/366
(58) Field of Classification Search ............ 310/348, 310/364–366

See application file for complete search history.

(56) References Cited

U.S. PATENT DOCUMENTS

| 3,872,332 | A | * | 3/1975 | Butter | 310/334 |
| 4,417,170 | A | | 11/1983 | Benincasa | |
| 6,528,927 | B1 | * | 3/2003 | Schuh et al. | 310/328 |
| 6,552,471 | B1 | * | 4/2003 | Chandran et al. | 310/328 |
| 6,946,779 | B1 | * | 9/2005 | Birgel | 310/366 |

FOREIGN PATENT DOCUMENTS

| DE | 196 46 676 C1 | 4/1998 |
| DE | 197 25 717 A1 | 2/1999 |
| DE | 199 59 169 A1 | 8/2000 |
| DE | 100 28 319 A1 | 12/2001 |
| DE | 100 39 255 A1 | 2/2002 |
| JP | 60-121784 | * 6/1985 |
| JP | 63-88875 | * 4/1988 |
| JP | 11-4027 | 1/1999 |
| WO | WO 99/34455 | 7/1999 |

OTHER PUBLICATIONS

Patent Abstracts of Japan, vol. 009, No. 185 (E-332), Jul. 31, 1985 & JP 60 054486 A, Toshiba Corp., Lead Wire Connecting Portion of Polymer Element.

* cited by examiner

*Primary Examiner*—Thomas M. Dougherty
(74) *Attorney, Agent, or Firm*—Bacon & Thomas

(57) ABSTRACT

An electromechanical transducer with at least one piezoelectric element with a first surface on which a first electrode is applied, and at least one contact flag, through which the piezoelectric element is electrically connected. The electrical connection of the piezoelectric element is of very high contact reliability, in that the contact flag directly contacts the first electrode and exhibits at least one depression, into which an adhesive is placed, by which the contact flag is connected with the electrode.

7 Claims, 2 Drawing Sheets ical element.

ELECTROMECHANICAL CONVERTER COMPRISING AT LEAST ONE PIEZOELECTRIC ELEMENT

FIELD OF THE INVENTION

The invention relates to an electromechanical transducer with at least one piezoelectric element.

BACKGROUND OF THE INVENTION

Today there are many devices, especially measuring instruments and sensors, in which piezoelectric elements are used as electromechanical transducers.

There are e.g. fill level limit switches commercially available, which are used for limit level detection, overfill prevention or protection against pumps running dry. These have e.g. a mechanical oscillation structure extending into a container. The structure is caused to oscillate by means of a piezoelectric element or by means of a plurality of piezoelectric elements arranged in a stack. The resonance frequency and/or the amplitude of an excited oscillation is registered, and from this it is determined whether the oscillation structure is oscillating freely or, instead, covered with a fill material.

The piezoelectric elements are usually provided with electrodes and are connected by means of electrical contact flags or lugs. The contact flags are connected with an electronic circuit by way of electrical conductors, through which the piezoelectric elements are either excited to oscillate, or their oscillation-dependent signals are registered.

Examples of electromechanical transducers with one or more piezoelectric elements are described in EP-A 875 742, EP-A 875 741, EP-A 875 740, EP-A 875 739 and European Patent Application 10028319.5 filed 7 Jun. 2000.

Presently, the contact flags are adhesively attached to the electrodes. Adhesives are always applied onto a flat area of the contact surfaces of the electrodes, or of the contact flags, as the case may be. The thickness of the adhesive layer depends in such practice on the amount of adhesive applied, the contact pressure under which the parts to be bonded are brought together, and the, in part, also temperature-dependent viscosity of the adhesive before it sets. The finite thickness of the adhesive layer means that there will be a gap between the electrode and the contact flag. Such a gap occurs naturally also in the alternative practice where the contact flag is provided with solder dots and the electrode is soldered on.

With time, the adhesive experiences aging effects, which can affect the contact reliability of the connection.

SUMMARY OF THE INVENTION

It is an object of the invention to provide an electromechanical transducer having at least one piezoelectric element, characterized by an electrical connection of the piezoelectric element with a very high contact reliability.

To accomplish this object, the invention comprises an electromechanical transducer with at least one piezoelectric element with a first surface on which a first electrode is applied, and at least one contact flag, through which the piezoelectric element is electrically connected, which directly contacts the first electrode, and which exhibits at least one depression, into which an adhesive is placed, by which the contact flag is connected with the electrode.

In one development of the invention, the adhesive is electrically conductive.

In one development of the invention, the adhesive is an adhesive that is usable for the securement of SMD-components.

In one development of the invention, the depression is etched into the contact flag.

In one development of the invention, the piezoelectric element has on the first surface at least one more electrode, and, for each electrode, a contact flag is provided, which electrically connects its associated electrode.

In one development of the invention, the contact flags are connection flags extending from a circuit board, particularly a printed circuit board, and the connection flags become conductor paths in the circuit board.

In one development of the invention, the circuit board is a flexible circuit board, which has a plurality of contact flags, wherein, on each contact flag, a piezoelectric element is arranged, and the piezoelectric elements are arranged in a stack.

Additionally, the invention includes a method for producing an above-mentioned electromechanical transducer, wherein the depressions in the contact flags are etched in, adhesive is placed in the depressions, and the piezoelectric element is set onto the contact flags by machine.

The invention and further advantages will now be explained in more detail on the basis of the figures of the drawing, where three examples of embodiments are presented; equal elements are provided in the figures with the same reference characters.

DESCRIPTION OF THE PREFERRED EMBODIMENTS

Figure 1:
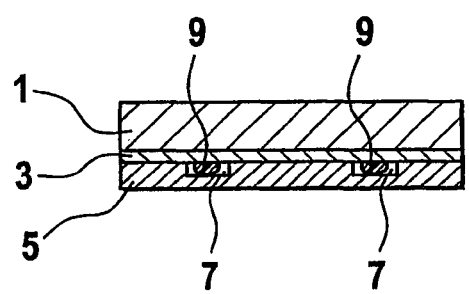
FIG. 1 shows schematically a piezoelectric element with a contact flag connected therewith.

FIG. 1 shows schematically an electromechanical transducer. The transducer includes a piezoelectric element 1. The piezoelectric element 1 is in the form of a circular disk in the illustrated embodiment and exhibits a first surface, on which a first electrode 3 is located. The first electrode 3 is e.g. a thin silver layer, which is applied on the piezoelectric element 1, e.g. by sputtering. A contact flag 5 is provided, over which the piezoelectric element 1 is electrically connected.

Figure 2:
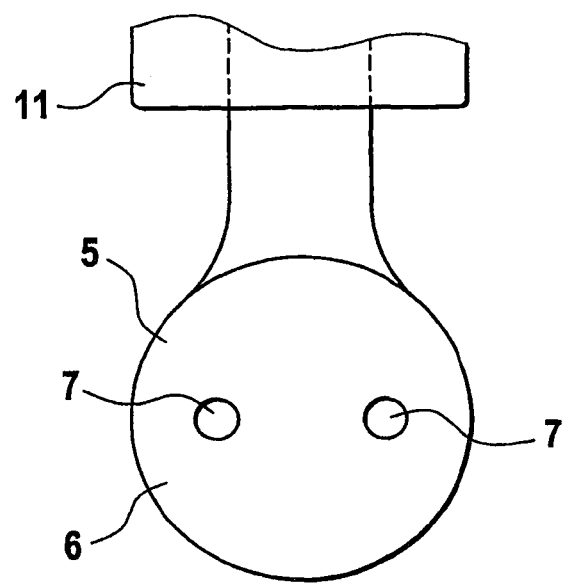
FIG. 2 shows a plan view of the side of the contact flag facing the piezoelectric element.

FIG. 2 shows a plan view of the side of the contact flag facing the piezoelectric element. The contact flag 5 has a circular, disk-shaped section 6, the surface of which directly contacts the first electrode 3. The contact flag 5 contains at least one depression 7, and an adhesive 9 is placed in each depression. The embodiment of FIG. 1 has two depressions. The adhesive 9 connects the contact flag 5 with the electrode 3.

Especially suited to serve as adhesive 9 are e.g. an electrically conductive adhesive, or an adhesive of the type used for securing SMD components.

In the illustrated embodiment, contact flag 5 is an integral part of a flexible circuit board 11. Flexible circuit boards are available e.g. from the firm Schoeller Elektronik under the trademark Polyflex. They are made e.g. of a thin copper sheet, which is first processed by the firm Schoeller Elektronik in an etching process according to a desired conductor path configuration. Then, both sides of the resulting configuration are laminated with a thick polyimide covering film.

The embodiment illustrated in FIG. 2 uses a flexible circuit board 11, in which the contact flag 5 is a connection flag of sheet material extending from the flexible circuit board 11. The connection flag is an integral part of the flexible circuit board 11. It is e.g. an appropriately formed segment of the copper sheet, without the covering film. The depressions 7 are preferably etched into the contact flag 5. The depressions have e.g. a depth of 3 μm.

Preferably, large amounts of flexible circuit boards are processed by machine batchwise. An etching mask is used to guide the etching of the depressions 7 on all circuit boards of the batch. Then, the adhesive 9 is applied by machine from a dispenser or by screen printing. In a last processing step, the piezoelectric elements 1 are positioned and pressed in place. If an adhesive 9 is used that shrinks during hardening, then the two components, contact flag and piezoelectric element with electrode, are additionally pulled together by the bond provided by adhesive 9.

Since the adhesive remains completely in the depressions 7, a quasi gap-free electric coupling of the contact flag 5 onto the electrode 3 is obtained. The separation between the contact flag 5 and the electrode 3 is essentially determined by the manufacturing tolerances in the production of electrode 3 and contact flag 5. The separation lies clearly below 10 μm. At these small separations, there is, in the quality of the electrical connection, no longer any difference between a capacitive and a conductive connection.

Instead of a single electrode arranged on the piezoelectric element, there can, of course, be two or more electrodes provided, each of which is connected in the above-described manner to a contact flag dedicated to its particular electrode.

Figure 3:
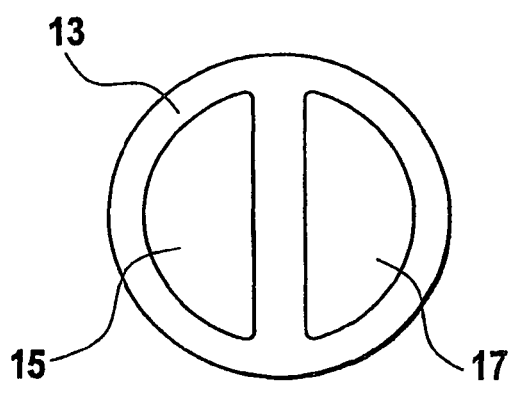
FIG. 3 shows a view of a piezoelectric element where two electrodes are arranged on a first surface.

FIG. 3 shows a view of a first surface of a piezoelectric element 13, where two electrodes 15, 17 are arranged on the first surface. The electrodes 15, 17 are of semicircular shape and can e.g. serve to excite the two halves of a circular-disk-shaped, homogeneously polarized, piezoelectric element to execute oscillations of opposite phase. Other applications of piezoelectric elements with at least two electrodes are described e.g. in EP-A 875 740 and EP-A 875 739.

Figure 4:
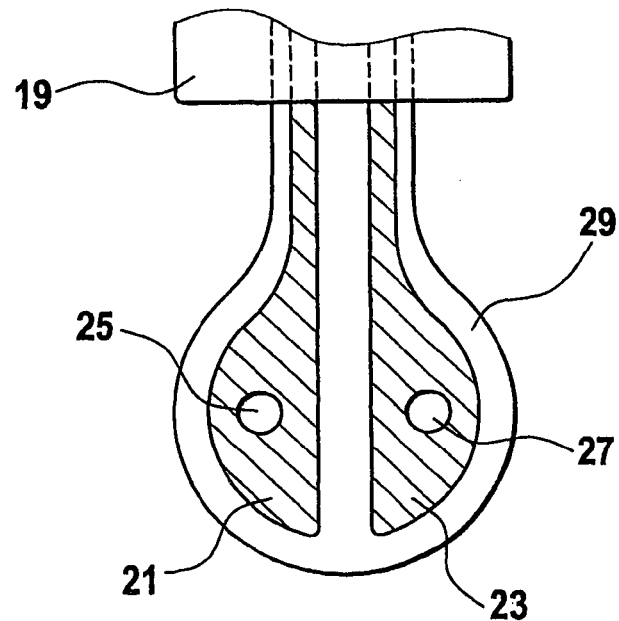
FIG. 4 shows a flexible circuit board having two contact flags.

FIG. 4 shows a view of a flexible circuit board 19 usable in connection with the piezoelectric element 13 illustrated in FIG. 3. The circuit board 19 has contact flags 21, 23, one for each electrode 15, 17, to electrically connect the electrodes 15, 17. In the embodiment of FIGS. 3 and 4, each contact flag 21, 23 has a depression 25, 27 for receiving the adhesive. The bonding and the electrical connection of the electrodes 15, 17 proceeds analogously to the bonding and the electrical connection as it is explained above in the description of FIGS. 1 and 2.

Also the embodiment illustrated in FIG. 4 uses a flexible circuit board, in which the contact flags 21, 23 are connection flags of sheet material extending from the flexible circuit board 19. The connection flags are integral parts of the flexible circuit board 11. They are e.g. appropriately formed segments of the copper sheet. The segments in this embodiment are provided with a covering film 29 on the side opposite to that facing the piezoelectric element 13. The sides of the contact flags 21, 23 facing the piezoelectric element 13 are bare. In the circuit board 19, the contact flags 21, 23 become conductor paths extending in the circuit board 19. The depressions 25, 27 are, in this case also, etched into the contact flags 21, 23 to a depth of about 3 μm.

Figure 5:
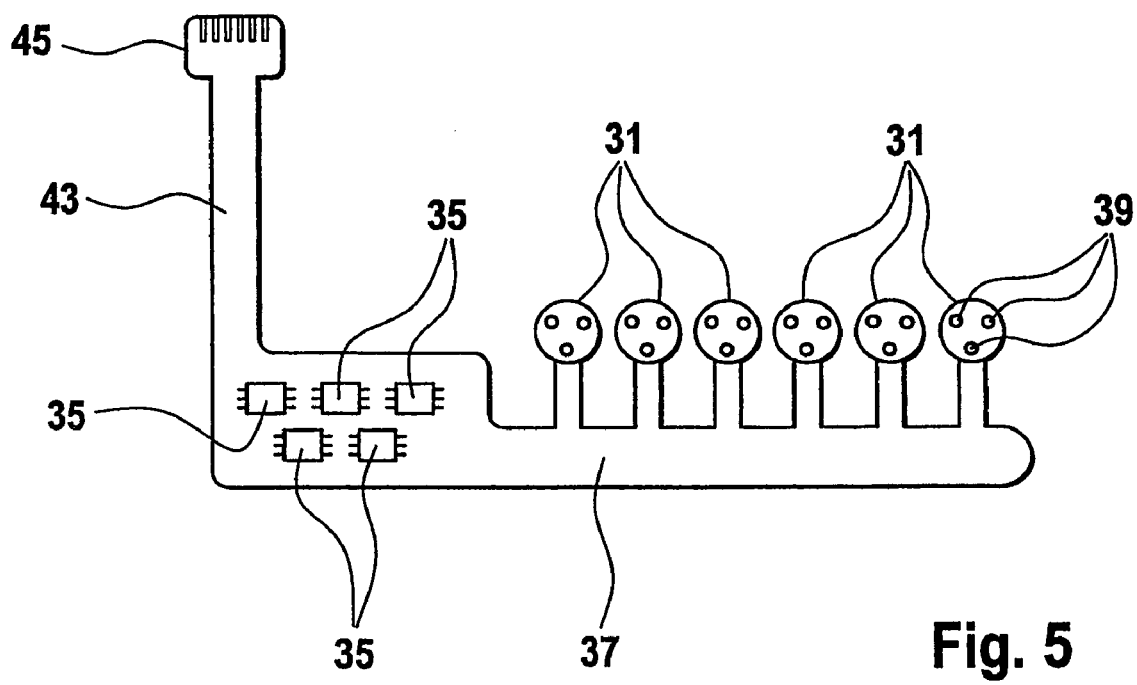
FIG. 5 shows a flexible circuit board with six contact flags.
Figure 6:
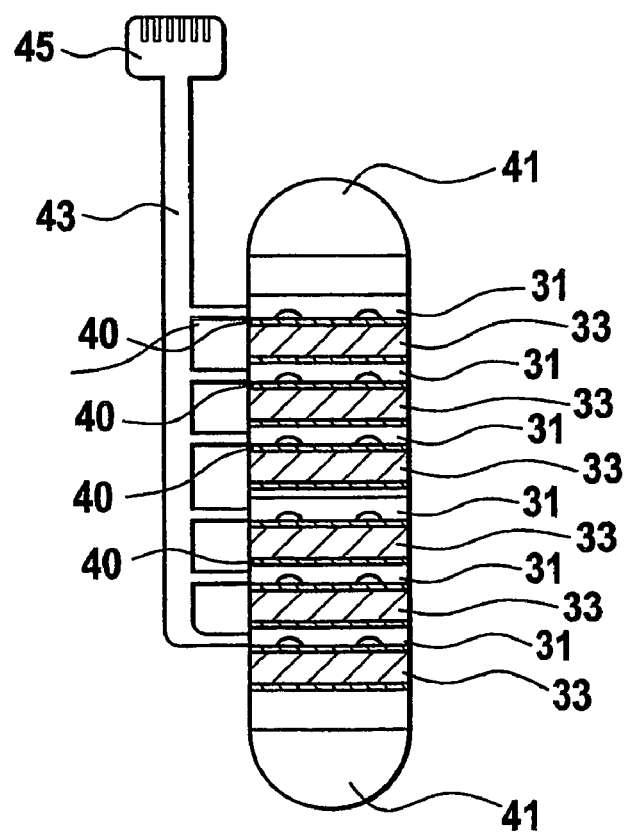
FIG. 6 shows piezoelectric elements arranged in a stack and connected on contact flags.

FIGS. 5 and 6 illustrate another embodiment of an electromechanical transducer of the invention. FIG. 5 shows a view of a flexible circuit board, which has a number of contact flags 31 extending from a flexible circuit board, as described previously in connection with FIGS. 1–4. FIG. 6 shows the circuit board of FIG. 5, where now a piezoelectric element 33 is arranged on each contact flag 31, and the piezoelectric elements 33 are arranged in a stack.

The flexible circuit board has a branched section 37. Six branches are present in this embodiment. At the root of each branch, a connection flag of sheet material extends outwards to serve as a contact flag 31. Each connection flag is composed of a narrow path extending from the root out to a circular-disk-shaped electrode area. Provided in each electrode area are three depressions 39 which receive adhesive analogously to the previous embodiments.

Each two branches are separated from one another by a distance equal to the thickness of the piezoelectric element 33 between them.

In the mounting of the piezoelectric elements 33, an adhesive, e.g. a conductive adhesive or an SMD-adhesive, is placed in the depressions 39 and then the piezoelectric element 33 is applied. Each piezoelectric element 33 with an electrode 40 (hatched dark in FIG. 6) comes to lie in flush contact with an associated contact flag 31.

Following this, the flexible circuit board is deformed to arrange the contact flags 31 to be parallel to one another and mutually superimposed. In the embodiment illustrated here, as this is done, the contact flags 31 become aligned perpendicularly to the section 37, and section 37 rolls up, beginning from the end having the lowest branch. The piezoelectric elements 33 become stacked one on top of another. The thus pre-formed stack is then placed between two hemispherical platens 41 and pressed, to assure a good electrical contact between the contact flags 31 and the piezoelectric elements 33.

The form of flexible circuit board illustrated here is described in the European Patent Application 10028319.5 filed 7 Jun. 2000. Other variants of piezoelectric elements arranged in a stack are disclosed therein, for which the invention described here is analogously applicable.

The contact flags 31 become conductor paths within the circuit board. These paths permit the individual piezoelectric elements to be electrically addressable.

Depending on the circuitry, the separate piezoelectric elements 33 are connected electrically in series or parallel. Also, a plurality of piezoelectric elements 33 can be connected in series to form a transmitter and others in series to form a receiver.

The circuit board has a narrow extension 43 extending perpendicularly to the section 37. A plug 45 is provided on the end of the extension 43. Extension 43 contains all conductors of the circuit board which require a connection external to the circuit board.

Besides the piezoelectric elements 33, the circuit board carries electronic components, preferably SMD-components 35. These are e.g. current and voltage controlling elements or even components of a signal receiving and/or signal processing circuit. SMD-components 35 can be mounted together with the piezoelectric elements 33 in one process step.

In all described embodiments, the depressions 7, 25, 27, 39 are etched into the contact flags 5, 29, 31 in a first process step. Then, the adhesive is placed in the depressions 7, 25, 27, 39, preferably by machine, e.g. with a dispenser or by screen printing, following which the piezoelectric elements 1, 13, 33 are placed on the contact flags 7, 25, 27, 33, preferably also by machine. In doing this, the piezoelectric elements 1, 13, 33 are handled preferably as SMD-components and placed on the circuit boards together with possibly required SMD-components 35 by means of an automatic populating machine.

Placement of the adhesive 9 in the depressions 7, 25, 27, 39 assures a very good and constant electrical connection of the piezoelectric elements 1, 13, 33. At the same time, a fully automatable manufacturing process is possible.

The invention claimed is:

1. An electromechanical transducer, comprising:
   a first electrode;
   at least one piezoelectric element with a first surface on which said first electrode is applied; and
   at least one contact flag, wherein:
   said at least one piezoelectric element is electrically connected through said at least one contact flag,
   said at least one contact flag directly contacts said first electrode; and
   said at least one contact flag has at least one depression, into which an adhesive is placed, by which said contact flag is connected with said first electrode.

2. The electromechanical transducer as defined in claim 1, wherein:
   said adhesive is electrically conductive.

3. The electromechanical transducer as defined in claim 1, wherein:
   said adhesive is an adhesive that is usable for the securement of SMD-components.

4. The electromechanical transducer as defined in claim 1, wherein:
   said at least one depression is etched into said contact flag.

5. The electromechanical transducer as defined in claim 1, wherein:
   said at least one piezoelectric element has at least one more electrode on said first surface; and
   for each electrode, a contact flag is provided, which electrically connects its associated electrode.

6. The electromechanical transducer as defined in claim 1, wherein:
   said contact flags are connection flags extending from a circuit board; and
   in the circuit board, said connection flags become conductor paths in the circuit board.

7. The electromechanical transducer as defined in claim 6, wherein:
   the circuit board is a flexible circuit board, which has a plurality of contact flags, on each contact flag, a piezoelectric element is arranged; and
   the piezoelectric elements are arranged in a stack.

* * * * *